United States Patent [19]
Azar

[11] Patent Number: 5,158,136
[45] Date of Patent: Oct. 27, 1992

[54] PIN FIN HEAT SINK INCLUDING FLOW ENHANCEMENT

[75] Inventor: Kaveh Azar, Westwood, Mass.

[73] Assignee: AT&T Laboratories, Murray Hill, N.J.

[21] Appl. No.: 790,897

[22] Filed: Nov. 12, 1991

[51] Int. Cl.⁵ .............................................. F28F 7/00
[52] U.S. Cl. .................................. 165/185; 165/80.3; 174/16.3; 361/383
[58] Field of Search ...................... 165/80.2, 80.3, 185; 174/16.3; 361/383

[56] References Cited

U.S. PATENT DOCUMENTS

| | | | |
|---|---|---|---|
| 2,722,048 | 11/1955 | Gier, Jr. ........................... | 165/185 X |
| 2,892,618 | 6/1959 | Holm ................................. | 165/185 |
| 3,327,779 | 6/1967 | Jacoby .............................. | 165/185 |
| 3,524,497 | 8/1970 | Chu et al. ........................ | 165/185 X |
| 4,277,816 | 7/1981 | Dunn et al. ..................... | 361/384 |

FOREIGN PATENT DOCUMENTS

| | | | |
|---|---|---|---|
| 246432 | 11/1987 | European Pat. Off. ........... | 174/16.3 |
| 633376 | 11/1986 | United Kingdom .............. | 165/80.4 |

OTHER PUBLICATIONS

Simons, "Micro-Modular Air-Cooling Scoop" *IBM TDB* vol. 22 #1 Jun. 1979 pp. 240–241.
"Heat Dissipation Components For Semiconductors, Computers, and Power Supplies", EG&G Wakefield Engineering, Copyright 1988.
"DELTEM ™ Composite Heat Sinks Introduce a New Dimension To Electronics Heat Transfer", EG&T Wakefield Engineering, Printed Jun. 1989.

*Primary Examiner*—Allen J. Flanigan
*Attorney, Agent, or Firm*—T. Stafford

[57] ABSTRACT

Heat dissipation performance of a pin fin heat sink is improved by utilizing a flow guide arrangement. Flow guide members are positioned relative to the outer rows of the pin fins and longitudinal to fluid flow through the pin fin field of the heat sink. A gap between a lower edge of each flow guide member and a base surface of the heat sink forms apertures allowing potentially stagnant fluid in an interior region of the pin fin field of the heat sink to communicate with fluid flowing around the exterior of the heat sink. This causes a so-called "pump" action in which the potentially stagnant fluid is drawn along with the fluid flowing around the exterior of the heat sink.

18 Claims, 3 Drawing Sheets

PIN FIN HEAT SINK INCLUDING FLOW ENHANCEMENT

TECHNICAL FIELD

This invention relates to apparatus for dissipating heat from a surface and, more particularly, to pin fin heat sinks.

BACKGROUND OF THE INVENTION

Heat sinks are so-called extended surfaces that have been used to enhance cooling of heat dissipating surfaces. Such heat sinks have been fabricated in a number of designs. The designs are such as to decrease fluid flow impedance through the heat sink and, thereby, improve heat dissipation performance. The pin fin heat sink is of particular interest because it is one of the commonly used heat sinks.

FIGS. 1 and 2 show prior art pin fin heat sinks. FIG. 1 is a top view of pin fin heat sink 100 showing fluid flow (gas or liquid) relative to the heat sink. Heat sink 100 includes a base surface 101 having a plurality of pin fins 102 perpendicular to and protruding therefrom. In this example, pin fins 102 are in staggered rows. Pin fins 102 could equally be in aligned rows on base surface 101. It is noted and has been observed by me that after approximately the first two (2) rows of the pin fins, the fluid flow loses a significant amount of its inertial force and tends to slow, potentially becoming quasi-stagnant (herein after referred to as stagnant). Thus, as seen in FIG. 1, the normal fluid flow at velocity V1 is supplied in the left-to-right direction. The fluid flow begins to slow down after a few rows of pin fins and has a velocity of V3. In this example, the fluid around the heat sink increases to velocity V2 and part of it is entrained into the right side of the heat sink against the normal direction of flow. It has also been observed that velocity V2 is approximately twice V1 (V2≈2V1) and the velocity V2 is very much greater than V3 (V2>>V3). FIG. 2 shows a side view of the pin fin heat sink 100. FIG. 2 illustrates that because of the fluid back flow being entrained into the right side of the heat sink that the fluid entering from the left is forced to flow out of the top of the pin fins 102. The stagnation of the fluid flows also contributes to the fluid exiting from the top rather than flowing completely through the pin fins of the heat sink. Consequently, the fluid flow process described contributes to inefficiencies in dissipating heat from the surface to which the heat sink is attached.

SUMMARY OF THE INVENTION

The problems relating to fluid flow over and through prior pin fin heat sink arrangements are minimized, in accordance with the invention, by employing a flow guide arrangement which is in prescribed spatial relationship to the pin fins of the heat sink and direction of fluid flow over and through the pin fins. The flow guide arrangement is such as to cause a "pump" action, by creating a pressure difference, of the fluid flow through and over the heat sink. The desired pump action is realized, in accordance with the invention, by providing a gap between the upper base surface of the heat sink and the lower edge of the flow guide arrangement. This gap allows potentially stagnant fluid in an interior region of the heat sink to communicate with a higher velocity fluid flowing around the exterior of the heat sink. The higher velocity fluid flow tends to draw the potentially stagnant fluid along with it, thereby improving overall fluid flow through and over the pin fins of the heat sink.

In a specific embodiment, rectangular flow guide members are utilized which have prescribed dimensions dependent on the height of the pin fins and length of the heat sink. These flow guide members are mounted parallel to each other in prescribed spatial relationship to the outer rows of the pin fins. In a specific embodiment, the flow guide members are mounted on the outermost rows of the pin fins. Fluid flow is longitudinal to the length of the flow guide members. The rectangular flow guide members have a prescribed length so as to extend beyond each end of the heat sink and a prescribed width to provide a gap between the upper surface of the heat sink base and the bottom edge of the flow guide member. This gap forms apertures allowing communication between what would otherwise be stagnant fluid in the interior heat sink region and the higher velocity fluid flow around the exterior of the heat sink which results in the desired pump action. The gap height is selected to optimize the resulting pump action of the fluid flowing through and over the heat sink.

A technical advantage of the invention is improved fluid flow through the pin fin field of the heat sink which, in turn, provides improved thermal performance.

DETAILED DESCRIPTION

Figure 1:
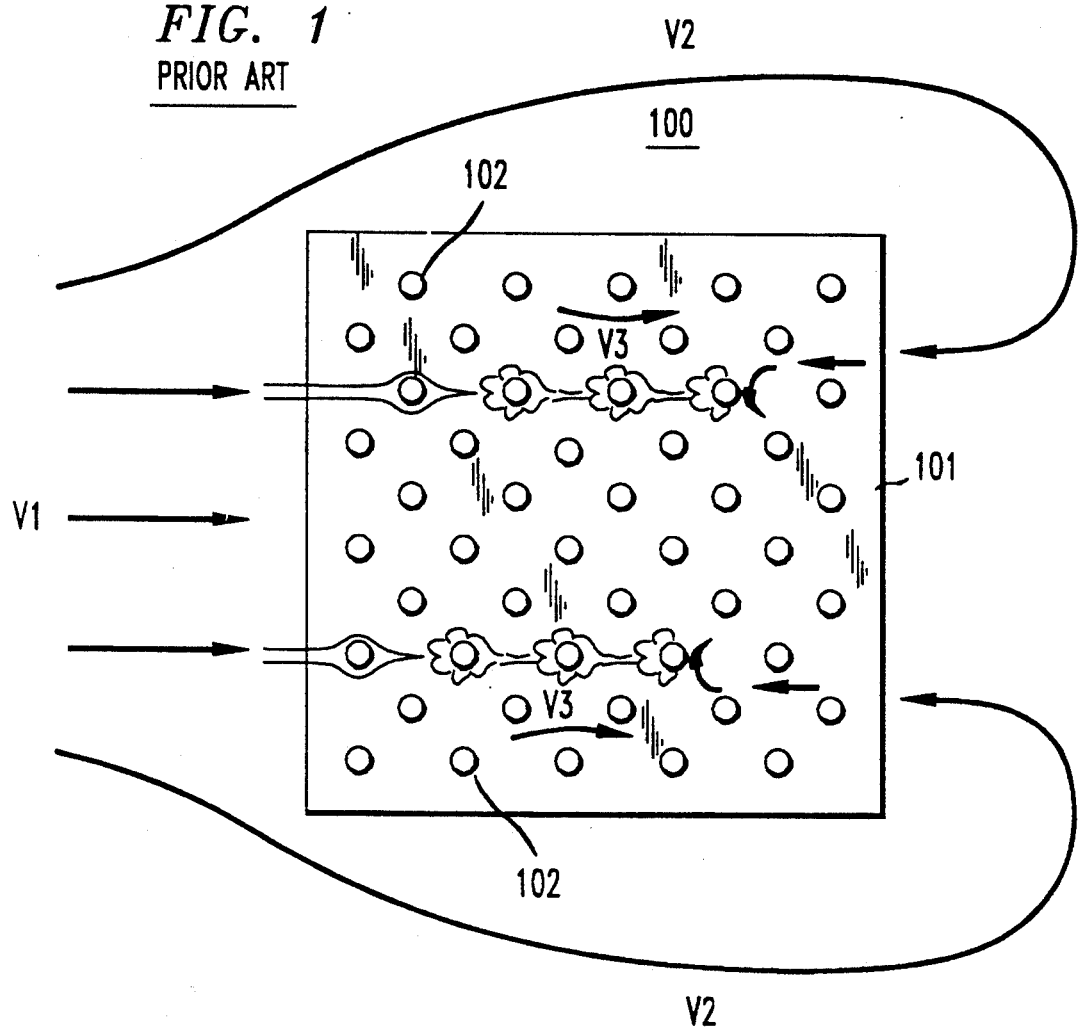
FIG. 1 shows a top view illustrating fluid flow over a prior art pin fin heat sink.
Figure 2:
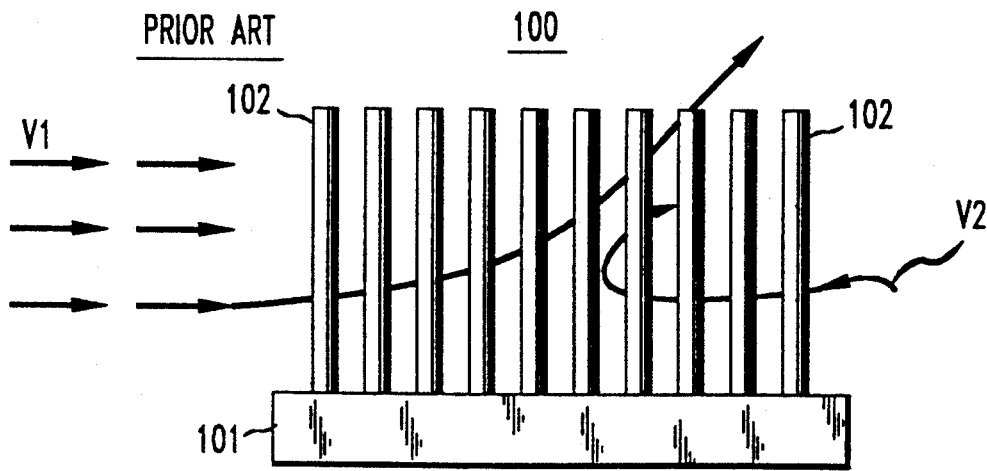
FIG. 2 shows a side view illustrating fluid flow through the prior art pin fin heat sink.

FIGS. 1 and 2, as discussed above, illustrate the effect of stagnated and entrained fluid flow relative to the prior known pin fin heat sink 100.

Figure 3:
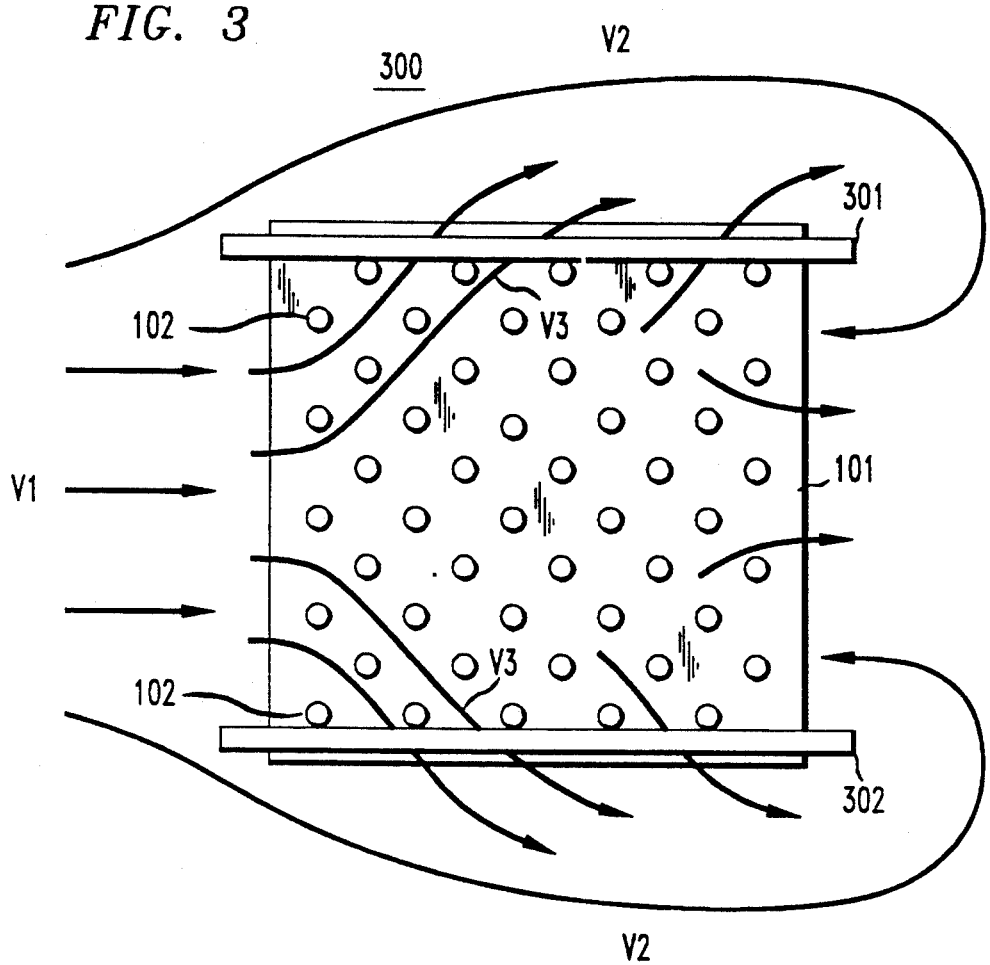
FIG. 3 shows a top view illustrating fluid flow over a pin fin heat sink including the invention.

FIG. 3 depicts a top view of pin fin heat sink 300 embodying the principles of the invention. Specifically, shown are base surface, i.e., plate, 101 having a plurality of pin fins 102 perpendicular to and protruding therefrom and flow guides 301 and 302 all forming, in combination, an embodiment of the invention. Although heat sink 300 is shown as including base surface 101 which is intended to be mounted on a heat dissipating surface, e.g., an electronic component or the like, the heat sink 300 can be made an integral part of the heat dissipating surface with pin fins 102 protruding therefrom. Moreover, pin fins 102 can take on any number of other geometric shapes. For example, pin fins 102 could be square, rectangular, diamond or triangular in cross-section. They can also be helical, spherical and made of wire mesh or solid or hollow cylinders or the like. As shown in FIG. 3, flow guides 301 and 302 are mounted on pin fins 102 of the outermost rows and are aligned longitudinal to the fluid flow V1. It will be apparent that flow guides 301 and 302 do not have to be directly attached to pin fins 102 of heat sink 300. Indeed, flow guides 301 and 302 could be mounted on a separate surface, e.g., a circuit board or the like, adjacent to the outer rows of pin fins 102. Additionally, flow guides 301 and 302 could also be mounted on interior rows of pin fins 102. However, I have found that the best flow pump action is obtained by locating flow guides 301 and 302 on or adjacent to the outer most rows of pin fins 102. In applications in which heat sink 300 has a large width between flow guides 301 and 302, it may be advantageous to locate one or more additional flow guides interior to flow guides 301 and 302.

Figure 4:
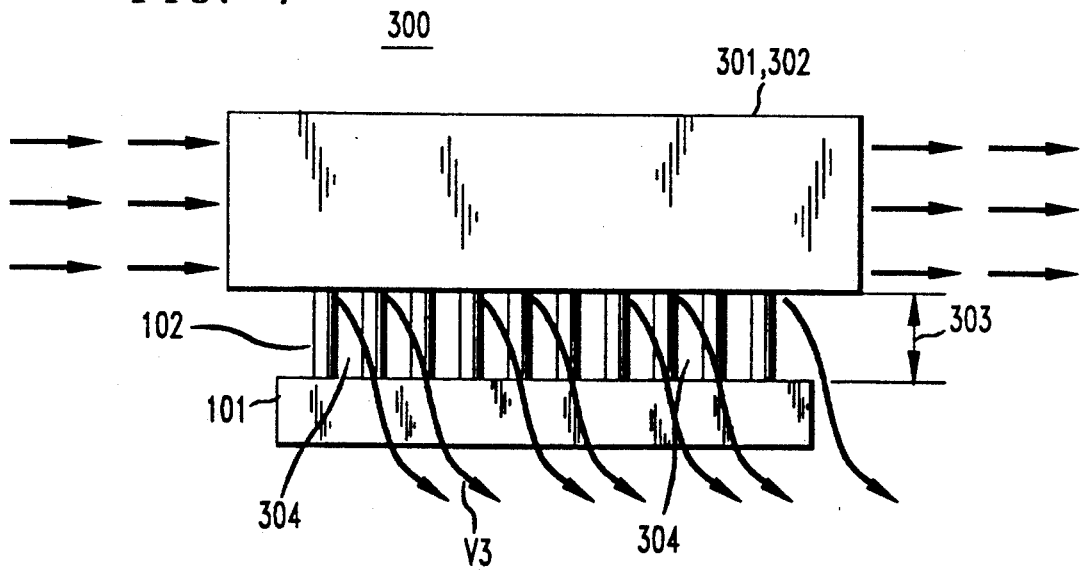
FIG. 4 shows a side view illustrating fluid flow through the pin fin heat sink including the invention.

Referring briefly to FIG. 4, it is seen that flow guides 301 and 302 are sized and positioned to provide gap 303 between their lower edges and the top of base surface 101. The size of gap 303 is such that the flow pump action resulting from apertures 304 formed thereby is maximized. I have determined that generally maximum flow pump action will be realized if the height of gap 303 is approximately one third ($\frac{1}{3}$) the height of pin fins 102. It should be noted that as the velocity of the fluid flow is increased, the height of gap 303 can be decreased. For most applications, I have determined that a minimum height of gap 303 is approximately 0.1 inch. Additionally, it will be apparent that gap 303 may be realized by employing other physical arrangements. For example, solid flow guide plates having a perforated lower portion or having appropriated sized slots or holes may be used to obtain apertures 304. The length of flow guides 301 and 302 is selected to extend beyond base surface 101 in the primary direction of the fluid flow. This extension of flow guides 301 and 302 tends to move a "wake" region of heat sink 300 and the surface is mounted on further downstream, i.e., away from heat sink 300. This further improves heat dissipation performance of heat sink 300 because less fluid is entrained and, in turn, less stagnation in the fluid flow results. I have determined that satisfactory results are obtained by extending the flow guide by approximately one-eight ($\frac{1}{8}$) of its length beyond base surface 101. It will be apparent that there are practical limitations on how far the length of flow guides 301 and 302 can be extended beyond base surface 101 of heat sink 300.

Returning to FIG. 3, it is readily seen that the stagnant fluid flow of the prior art pin fin heat sink is substantially eliminated. This is realized in accordance with the invention, by apertures 304 formed by gap 303 (FIG. 4) providing an interface for the potentially stagnant fluid in the interior region of heat sink 300 to communicate with the faster fluid flow V2 around heat sink 300. Consequently, the stagnant fluid flow engulfing pin fins 102 in the prior pin fin heat sink 100 (FIG. 1) is substantially eliminated. In the embodiment shown in FIGS. 3 and 4 the fluid flow velocity V2 around heat sink 300 is still approximately twice the primary fluid flow velocity V1 (V2≃2V1). However, the interior fluid flow velocity V3 has been increased significantly by employing the invention, but is still slower than V2 (V2>V3).

Figure 5:
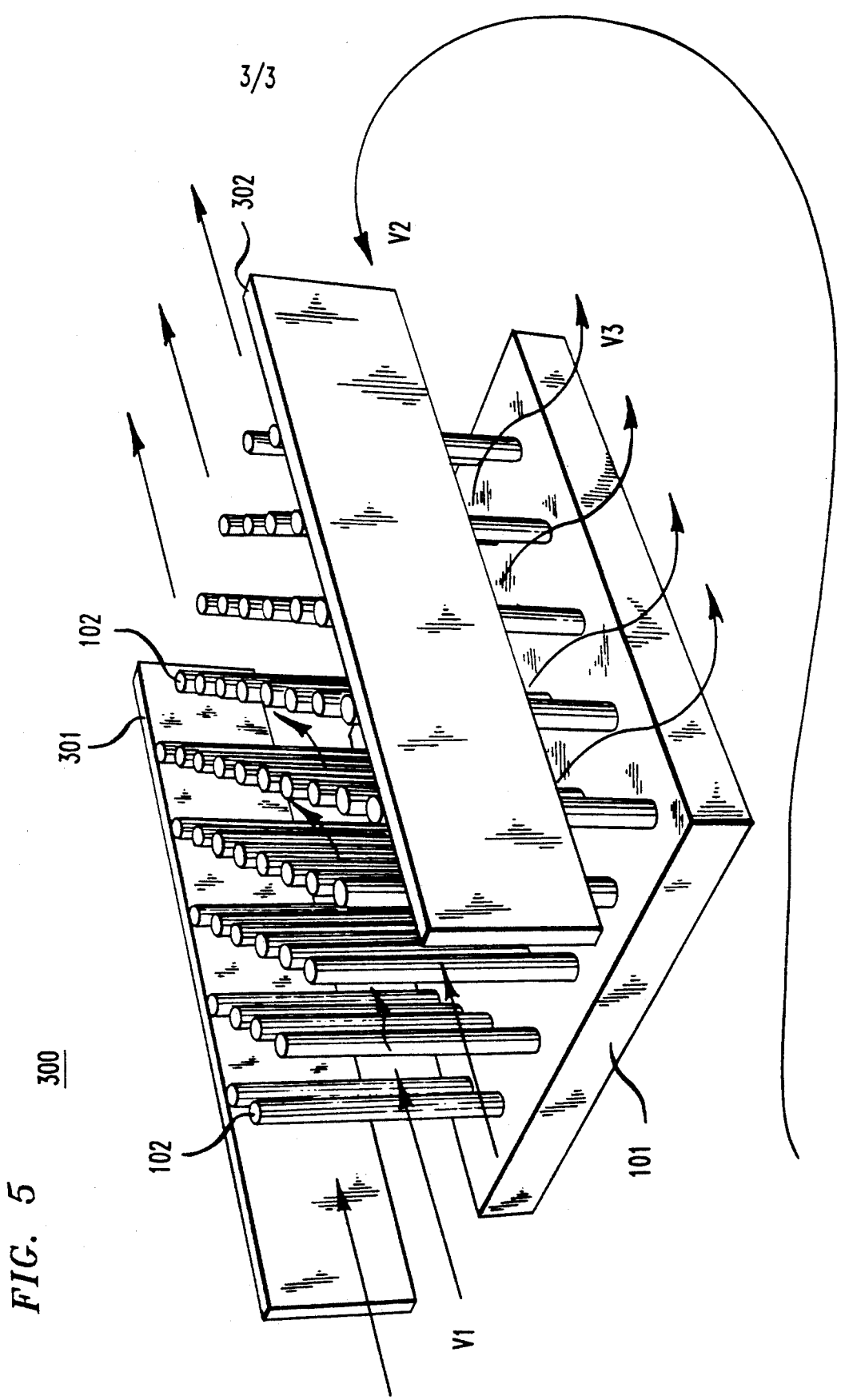
FIG. 5 shows a perspective illustrating fluid flow through and over the pin fin heat sink including the invention.

FIG. 5 shows a perspective of heat sink 300 including the invention. The elements of heat sink 300 shown in FIG. 5 have been labeled in identical fashion as those shown in FIGS. 3 and 4. These elements operate in the same fashion as those described above in relation to FIGS. 3 and 4 and are not again described in detail.

The above-described arrangements are, of course, merely illustrative of the application of the principles of the invention. Other arrangements may be devised by those skilled in the art without departing from the spirit or scope of the invention.

I claim:

1. Apparatus for dissipating heat comprising:
   a surface;
   a plurality of pin fins protruding from said surface; and
   flow guide means positioned in prescribed spatial relationship with said surface and said plurality of pin fins and being arranged for providing apertures along said flow guide means in predetermined spatial relationship to said surface so that fluid in an interior region formed by said plurality of pin fins is caused to communicate with fluid flowing exterior to the region formed by said plurality of pin fins along said flow guide means.

2. Apparatus as defined in claim 1 wherein said flow guide means includes at least first and second members each having upper and lower edges, said first and second members being positioned parallel to each other and in said prescribed spatial relationship with said surface and said plurality of pin fins, wherein said apertures are formed along said lower edges of said at least first and second members.

3. Apparatus for dissipating heat comprising:
   a surface;
   a plurality of pin fins protruding from said surface; and
   flow guide means including at least first and second members each having upper and lower edges and being positioned parallel to each other and in predetermined spatial relationship with predetermined ones of said plurality of pin fins so that there is a gap between the lower edge of each of said members and said surface, each of the gaps forming apertures for allowing fluid in an interior region formed by said plurality of pin fins to communicate through said apertures with fluid flowing exterior to the interior region.

4. Apparatus as defined in claim 3 wherein said plurality of pin fins are arranged in predetermined rows and said first and second members are positioned in a prescribed relationship with outer rows of said pin fins.

5. Apparatus as defined in claim 4 wherein each of said pin fins has a top and a predetermined height and wherein each of said first and second members is substantially rectangular having a length and a width, said width of said first and second members being a function of said height of said pin fins.

6. Apparatus as defined in claim 5 wherein said first member is mounted on an outer row of said pin fins and said second member is mounted on an outer row of said pin fins opposite said first member.

7. Apparatus as defined in claim 5 wherein said first and second members are positioned so that their upper edges are substantially level with the tops of said pin fins and said width of said first and second members is such that said gap has a height approximately one third ($\frac{1}{3}$) said height of said pin fins.

8. Apparatus as defined in claim 5 wherein wherein said first and second members are positioned so that their upper edges are substantially level with the tops of said pin fins and said width of said first and second members is such that said gap has a height not less than approximately one tenth (0.1) inch.

9. Apparatus as defined in claim 5 wherein said surface has a predetermined length and wherein the length of each of said first and second members is such that said first and second members extend beyond the length of said surface.

10. A heat sink comprising:
a base plate having an upper surface;
a plurality of pin fins protruding from said upper surface of said base plate; and
at least first and second flow guide members having upper and lower edges, said first and second flow guide members being in predetermined spatial relationship with predetermined ones of said plurality of pin fins and said upper surface of said base plate so that there are apertures formed between said lower edges of said first and second flow guide members and the upper surface of said base plate for fluid flow from an interior region of the heat sink.

11. The heat sink as defined in claim 10 wherein said first and second flow guide members are positioned parallel to each other and in said prescribed spatial relationship with said upper surface of said base plate and said plurality of pin fins.

12. The heat sink as defined in claim 11 wherein said predetermined spatial relationship is such that said first and second flow guide members are each positioned in predetermined relationship with predetermined ones of said plurality of pin fins so that there is a gap between the lower edge of each of said first and second flow guide members and said surface, each of the gaps forming said apertures for fluid flow from said interior region of the heat sink.

13. The heat sink as defined in claim 12 wherein said plurality of pin fins are arranged in predetermined rows and said first and second flow guide members are positioned in a prescribed relationship with outer rows of said pin fins.

14. The heat sink as defined in claim 13 wherein each of said pin fins has a top and a predetermined height and wherein each of said first and second flow guide members is substantially rectangular having a length and a width, said width of said first and second flow guide members being a function of said height of said pin fins.

15. The heat sink as defined in claim 14 wherein said first flow guide member is mounted on an outer row of said pin fins and said second flow guide member is mounted on an outer row of said pin fins opposite said first flow guide member.

16. The heat sink as defined in claim 14 wherein said first and second flow guide members are positioned so that their upper edges are substantially level with the tops of said pin fins and said width of said first and second flow guide members is such that said gap has a height approximately one third ($\frac{1}{3}$) said height of said pin fins.

17. The heat sink as defined in claim 14 wherein wherein said first and second flow guide members are positioned so that their upper edges are substantially level with the tops of said pin fins and said width of said first and second flow guide members is such that said gap has a height not less than approximately one tenth (0.1) inch.

18. The heat sink as defined in claim 14 wherein said base plate has a predetermined length and wherein the length of each of said first and second flow guide members is such that said first and second flow guide members extend beyond the length of said base plate.

* * * * *